(12) United States Patent
Sekii

(10) Patent No.: US 6,628,720 B1
(45) Date of Patent: Sep. 30, 2003

(54) TRANSMITTING APPARATUS AND REPRODUCING APPARATUS

(75) Inventor: Yasuaki Sekii, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/433,571

(22) Filed: Nov. 4, 1999

(30) Foreign Application Priority Data

Nov. 6, 1998 (JP) .......................................... 10-316228

(51) Int. Cl.[7] .............................................. H03M 7/32
(52) U.S. Cl. ........................................ 375/247; 341/77
(58) Field of Search ................................ 375/295, 242, 375/244, 247; 341/118, 126, 143, 155, 77

(56) References Cited

U.S. PATENT DOCUMENTS

| | | | |
|---|---|---|---|
| 4,490,838 A | 12/1984 | Nishioka et al. | ............... 381/15 |
| 4,851,841 A | 7/1989 | Sooch | |
| 5,048,091 A | 9/1991 | Sato et al. | ................... 381/107 |
| 5,140,324 A | 8/1992 | Przybysz et al. | ........... 341/133 |
| 5,646,621 A * | 7/1997 | Cabler et al. | ................ 341/143 |
| 5,706,308 A | 1/1998 | Ichimura | |
| 6,064,326 A * | 5/2000 | Krone et al. | ................. 341/143 |

FOREIGN PATENT DOCUMENTS

EP 0778676 11/1997 ............ H03M/7/00

OTHER PUBLICATIONS

"Sigma–Delta Signal Processing" (Dias) p. 421–424.
"Sample Rate Conversion For Digital Audio Processing", Henriquez, et al., *Proceedings* (1990), 1:233–237.

* cited by examiner

*Primary Examiner*—Stephen Chin
*Assistant Examiner*—David B. Lugo
(74) *Attorney, Agent, or Firm*—Jay H. Maioli

(57) ABSTRACT

A transmitting apparatus and a reproducing apparatus include a converter for converting an input one-bit digital signal into a multi-bit signal while effecting down-sampling of a sampling frequency. A one-bit digital signal that could develop an overflow (clip) depending on its modulation degree is attenuated at a stage upstream of the input of the converter, and the multi-bit signal is amplified at a stage downstream of the converter to avert a clipped state between the stages.

8 Claims, 6 Drawing Sheets

TRANSMITTING APPARATUS AND REPRODUCING APPARATUS

BACKGROUND OF THE INVENTION

The present invention relates to a transmitting apparatus and a reproducing apparatus whereby a one-bit digital audio signal acquired through delta-sigma modulation is converted to a multi-bit audio signal to be transmitted.

This application has already proposed a system whereby an analog audio signal is subjected to delta-sigma modulation at a sampling frequency significantly higher than that of the conventional compact disc (CD) in order to transmit, record and reproduce a one-bit digital audio signal.

The one-bit digital audio signal above is radically different from a multi-bit digital audio signal exemplified by the compact disc (CD) having a sampling frequency (fs) of 44.1 kHz and 16 quantization bits. That is, a high-quality audio standard offering a wide band and a wide dynamic range is implemented by means of the one-bit digital signal system that involves the quantization bits being sampled at a sampling frequency 64 times the sampling frequency (fs) of the conventional CD. This high-quality audio standard is called the DSD (Direct Stream Digital) standard, and discs having data recorded thereon as per the DSD Standard comply with what is known as the Super Audio CD Standard.

A one-bit digital audio signal obtained by delta-sigma modulation may be converted to a conventional multi-bit digital audio signal through down-sampling by a converter such as a decimation filter. Before the one-bit digital audio signal is output to a conventional digital audio interface that complies with IEC 958 (International Electrotechnical Commission 958), the signal needs to be converted to the conventional multi-bit digital audio signal through down-sampling.

In a setup where an analog audio signal is converted to a one-bit digital audio signal through delta-sigma modulation, there is defined a degree of modulation corresponding to the input conversion level in effect. That is, the modulation degree represents level information that is possessed by the one-bit digital audio signal in question. A maximum modulation degree, i.e., a maximum allowable input level defined by a delta-signal modulator in use, is generally established in accordance with an optimum point of modulator characteristics. If an analog audio signal level is input so as to obtain a maximum modulation degree, the rise of the level seldom results in an abrupt deterioration of level and distortion characteristics specific to an output one-bit digital audio signal.

Meanwhile, the modulation degree of an input one-bit digital audio signal and the level of an output multi-bit digital audio signal are generally determined in a unique manner for each decimation filter. For example, where a decimation filter is designed to have a maximum modulation degree of 50 percent, the filter outputs a multi-bit digital audio signal at its maximum value (i.e., full bit level) when a one-bit digital audio signal with the modulation degree of 50 percent is input. Upon input of a one-bit digital audio signal exceeding the maximum modulation degree, the multi-bit digital audio signal is kept fixed to the maximum value, i.e., brought into a clipped state.

The process above is explained below in more detail with reference to FIG. 1 which shows a conventional digital signal processing apparatus 50. In the digital signal processing apparatus 50, an analog audio signal $A_1$ input through an input terminal 51 is fed to a one-bit delta-sigma modulator 52 for delta-sigma modulation into a one-bit digital audio signal $D_1$. The one-bit digital audio signal $D_1$ from the modulator 52 is supplied to both a one-bit D/A converter 53 and a decimation filter 55.

FIG. 2 illustrates a typical constitution of the one-bit delta-sigma modulator 52 mentioned above. The one-bit delta-sigma modulator 52 comprises an adder 71, an integrator 72, a quantizer 73, and a delay circuit 75. An added output of the adder 71 is fed to the integrator 72. An integrated output of the integrator 72 is sent to the quantizer 73. A quantized output of the quantizer 73 is led out of an output terminal 74 and fed through the delay circuit 75 back to the adder 71 in which the quantized output is added to an analog audio signal coming from an input terminal 70. The added output of the adder 71 is integrated by the integrator 72 whose integrated output is in turn quantized by the quantizer 73 per sampling period. After the processing, one-bit quantized data, represented by the one-bit digital audio signal $D_1$, are output from the output terminal 74.

The one-bit D/A converter 53 converts the one-bit digital audio signal $D_1$ to an analog audio signal $A_0$ that is sent to an output terminal 54. Generally, the audio signal composed of one-bit digital audio signals is converted back to the analog audio signal by the D/A converter as described.

The decimation filter 55 turns the one-bit digital audio signal $D_1$ into a multi-bit digital audio signal $D_M$ that is fed to an output terminal 56. The decimation filter 55 converts the one-bit digital audio signal having the sampling frequency of 64×fs into a multi-bit digital audio signal of 16 bits with the sampling frequency of fs, whereby sound quality equivalent to that of CD is acquired. Typically, the decimation filter 55 has the maximum modulation degree of 50 percent.

There is a problem when the decimation filter 55 having the maximum modulation degree of 50 percent constitutes part of a converter that converts the one-bit digital audio signal $D_1$ through down-sampling into the multi-bit digital audio signal $D_M$. That is, if the level of an input one-bit digital audio signal $D_1$ exceeds the maximum modulation degree, the output multi-bit digital audio signal $D_M$ is fixed to a clip level.

Below is a detailed description of the deficiency outlined above. FIG. 3 is a graphic representation of characteristics indicating levels of an analog audio signal $A_0$ output by the one-bit D/A converter 53 and levels of a multi-bit digital audio signal $D_M$ furnished by the decimation filter 55 with respect to modulation degrees (input signal levels) of a one-bit digital audio signal $D_1$ from the one-bit delta-sigma modulator 52 in the digital signal processing apparatus 50. The levels of the analog audio signal $A_0$ are plotted by a broken line characteristic 61 while the levels of the multi-bit digital audio signal $D_M$ are depicted by a solid line characteristic 62.

The broken line characteristic 61 indicates that the levels of the analog audio signal $A_0$ remain approximately linear when the modulation degree of the input signal exceeds 50 percent. This is what is known as a soft clipped state, not perfectly linear, but almost. On the other hand, as indicated by the solid line characteristic 62, the multi-bit digital audio signal $D_M$ is clipped to a full bit level when the modulation degree exceeds 50 percent. The decimation filter 55 is designed to effect output at the full bit level illustratively when the modulation degree reaches 50 percent. Thus an input with the modulation degree of 50 percent or higher causes the output signal to be clipped as exemplified by the characteristic 62.

FIG. 4 is another graphic representation of characteristics plotting distortion factors of the analog audio signal $A_O$ output by the one-bit D/A converter 53 as well as distortion factors of the multi-bit digital audio signal $D_M$ furnished by the decimation filter 55 with respect to modulation degrees of the one-bit digital audio signal $D_1$ in the digital signal processing apparatus 50. The distortion factors of the analog audio signal $A_O$ are denoted by a broken line characteristic 63 while the distortion factors of the multi-bit digital audio signal $D_M$ are represented by a solid line characteristic 64.

The broken line characteristic 63 indicates that the distortion factor of the analog audio signal $A_O$ is at a minimum point when the modulation degree is about 50 percent. This means that the best characteristic is obtained for the analog audio signal $A_O$ when the one-bit delta-sigma modulator 52 is operating with its distortion factor at about 50 percent. On the other hand, as indicated by the solid line characteristic 64, the distortion factor of the multi-bit digital audio signal $D_M$ from the decimation filter 55 leaps abruptly when the modulation factor is near 50 percent. This phenomenon is attributable to the fact that the multi-bit digital audio signal $D_M$ is clipped to the full bit level when the modulation factor comes close to 50 percent.

As can be judged from FIGS. 3 and 4, the problem is evident: when the analog audio signal with its input level exceeding the maximum modulation factor of 50 percent is converted to a one-bit digital audio signal, the multi-bit digital audio signal $D_M$ acquired by the decimation filter 55 from the one-bit digital audio signal is clipped to a maximum level (full bit level) and manifests an extremely degraded distortion factor, although that is not the case with the analog audio signal $A_O$ obtained by subjecting the one-bit digital audio signal simply to digital-analog conversion.

As described, there are cases where the decimation filter 55 with its maximum modulation degree determined beforehand is used to make up a converter that converts a one-bit digital audio signal through down-sampling into a multi-bit digital audio signal. The trouble is that when the level of an input one-bit digital audio signal exceeds the maximum modulation degree, the multi-bit digital audio signal is fixed to its clip level.

Once the signal level is clipped by the decimation filter 55, the clipped state cannot be resolved by any downstream device executing level attenuation of the multi-bit signal. Furthermore, it is difficult theoretically to vary the level of the one-bit signal as desired. Attempts to vary the one-bit signal level would require expanding the scale of necessary signal processing circuits.

In particular, in the case of applications involving the one-bit digital audio signal system represented by the Super Audio CD, the maximum modulation degree is basically defined in terms of recording signals onto discs. There is a possibility that, reflecting the recording party's intentions, a disc may be produced with overmodulation, i.e., having levels exceeding the maximum modulation degree. When reproducing signals from such a disc, a disc player may subject a reproduced one-bit digital audio signal simply to digital-analog conversion for analog signal output. If the disc player has analog circuits with a sufficient dynamic range margin, those portions of the disc which are at an overmodulated level are played back at the same level as that in effect during recording.

When a decimation filter with its predetermined maximum modulation degree is used to convert a one-bit digital audio signal through down-sampling into a multi-bit audio signal that is output to a digital audio interface, the signal portions at overmodulated levels are always clipped to the maximum level during reproduction. In such a case, there are differences in terms of level and distortion factor between the analog and the digital output.

SUMMARY OF THE INVENTION

It is therefore an object of the present invention to overcome the above and other deficiencies and disadvantages of the prior art and to provide a transmitting apparatus and a reproducing apparatus wherein a one-bit digital audio signal is converted by a decimation filter constituting part of a converter into a multi-bit digital audio signal through down-sampling, and wherein the input of a one-bit digital audio signal exceeding a maximum modulation degree is prevented from resulting in a multi-bit digital audio signal with its level clipped to a full bit level (maximum level) while an average level of the output signal is improved.

In carrying out the invention and according to one aspect thereof, there is provided a transmitting apparatus comprising: attenuating means for attenuating by a predetermined quantity a first digital signal which is sampled at a first sampling frequency and which has one quantization bit; converting means for converting the first digital signal which was attenuated by the attenuating means, which was sampled at the first sampling frequency and which has one quantization bit, into a second digital signal which is sampled at a second sampling frequency lower than the first sampling frequency and which has multiple quantization bits; level detecting means for detecting a level of the second digital signal which was converted by the converting means, which was sampled at the second sampling frequency lower than the first sampling frequency and which has multiple quantization bits; and amplifying means for amplifying the level of the second digital signal which was sampled at the second sampling frequency and which has multiple quantization bits, in accordance with the level detected by the level detecting means.

According to another aspect of the invention, there is provided a reproducing apparatus comprising: reproducing means for reproducing from a recording medium a first digital signal which is sampled at a first sampling frequency and which has one quantization bit; attenuating means for attenuating by a predetermined quantity the first digital signal reproduced by the reproducing means; converting means for converting the first digital signal attenuated by the attenuating means into a second digital signal which is sampled at a sampling frequency lower than the first sampling frequency and which has multiple quantization bits; level detecting means for detecting a level of the second digital signal converted by the converting means; amplifying means for amplifying the level of the second digital signal which was sampled at the second sampling frequency and which has multiple quantization bits, in accordance with the level detected by the level detecting means; and transmitting means for transmitting the second digital signal amplified by the amplifying means.

Other objects, features and advantages of the invention will become more apparent upon a reading of the following description and appended drawings.

DESCRIPTION OF THE PREFERRED EMBODIMENTS

Preferred embodiments of this invention will now be described with reference to the accompanying drawings. An embodiment of the invention is implemented in the form of an audio disc player 1 which incorporates a digital audio interface output device in compliance with IEC 958 and which can play back high-quality audio discs.

Figure 1:
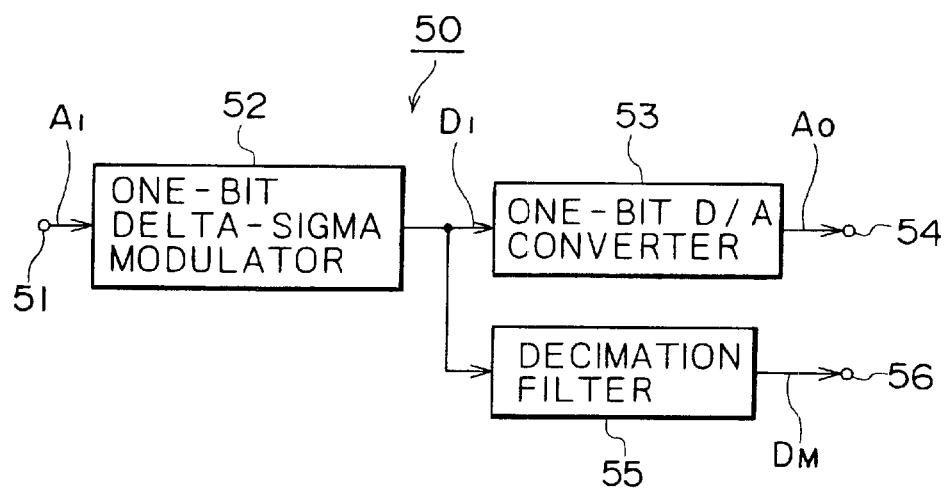
FIG. 1 is a block diagram of a digital signal processing apparatus embodying the invention.
Figure 2:
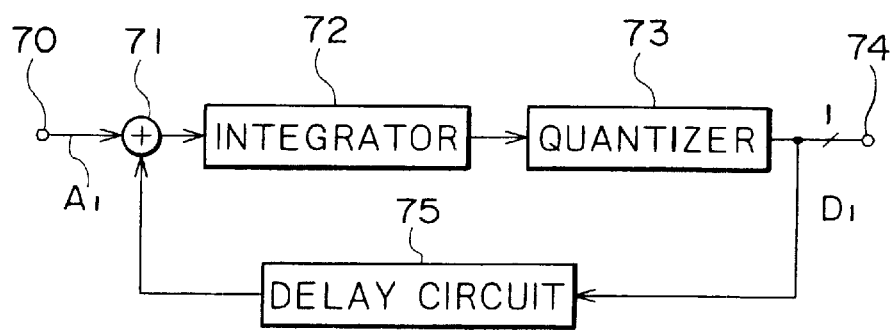
FIG. 2 is a block diagram of a one-bit delta-sigma modulator.
Figure 5:
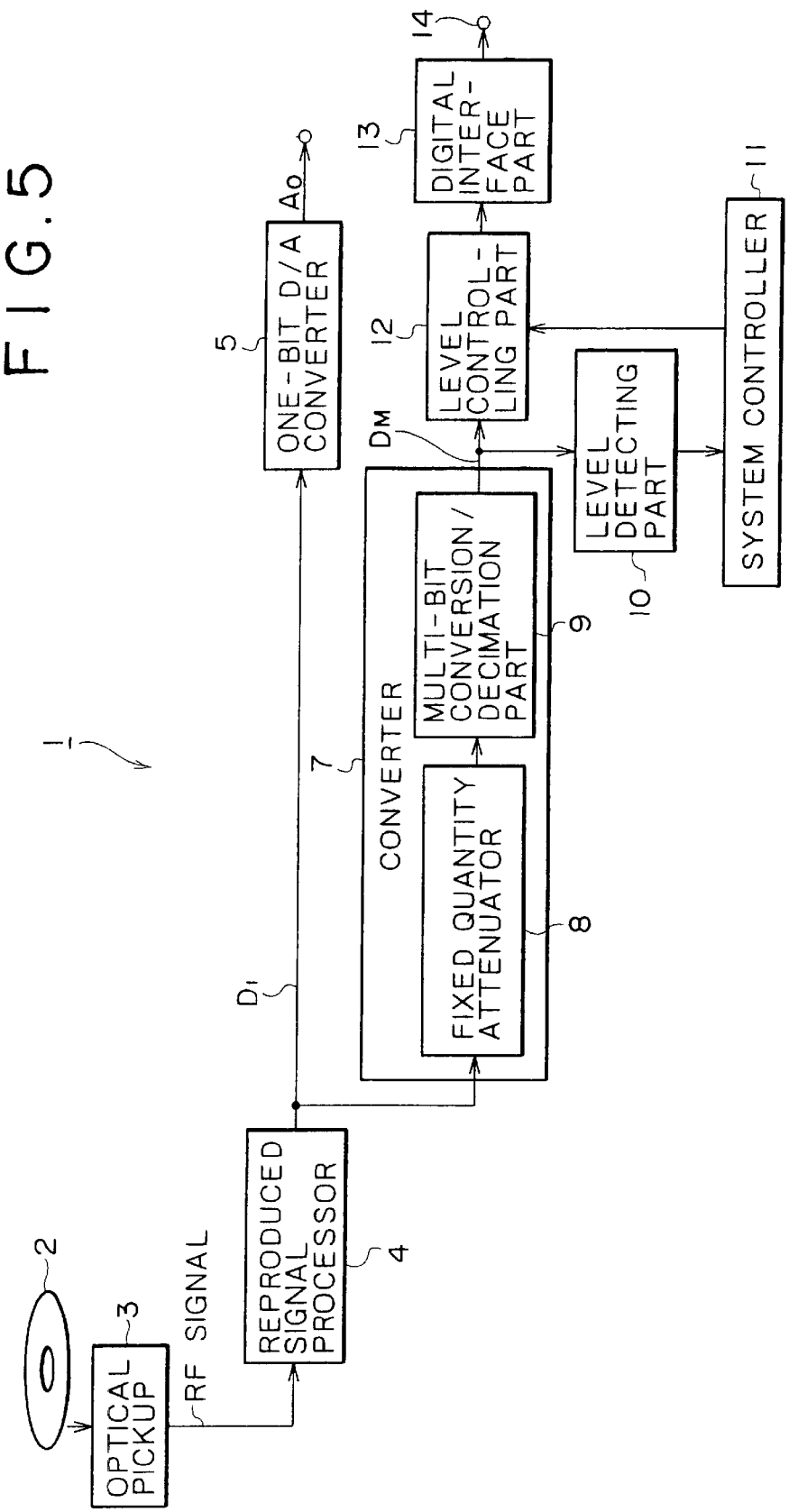
FIG. 5 is a block diagram of a reproducing apparatus embodying the invention.

The audio disc player 1, shown in FIG. 5, is capable of playing back an optical disc having one-bit digital audio signals recorded thereon. Each of these signals is sampled at a sampling frequency 64 times the sampling frequency (fs) for a CD, and has one quantization bit. A one-bit digital audio signal is acquired by the one-bit delta-sigma modulator whose constitution is shown in FIG. 2.

The audio disc player 1 comprises: an optical pickup 3 for reading a one-bit digital audio signal as an RF signal from an optical disc 2; a reproduced signal processor 4 that generates a one-bit digital audio signal $D_1$ by suitably processing the RF signal read by the optical pickup 3 while generating such servo signals as tracking and focusing signals; a one-bit D/A converter 5 for converting the one-bit digital audio signal $D_1$ from the reproduced signal processor 4 into an analog audio signal $A_0$; a converter 7 that converts the one-bit digital audio signal $D_1$ from the reproduced signal processor 4 into a multi-bit digital audio signal $D_M$ while performing attenuation; a level detecting part 10 for detecting the level of the multi-bit digital audio signal $D_M$ from the conversion by the converter 7; a level controlling part 12 for effecting control in such a manner that the multi-bit digital audio signal $D_M$ output by the converter 7 in keeping with the level detected by the level detecting part 10 will not exceed a full bit level; a system controller 11 for controlling the level controlling part 12 in accordance with the level detected by the level detecting part 10; and a digital interface part 13 for superposing the multi-bit digital audio signal from the level controlling part 12 onto an audio data area of a digital audio interface output pursuant to IEC 958. The digital audio interface output of the digital interface part 13 is effected through a digital output terminal 14. Alternatively, the digital audio interface output may be supplied to downstream filter means that eliminates high-frequency components.

The converter 7 includes a fixed quantity attenuator 8 and a multi-bit conversion/decimation part 9. Using the components, the converter 7 converts the one-bit digital audio signal $D_1$ to the multi-bit digital audio signal $D_M$ and performs a fixed attenuation process during down-sampling of the sampling frequency from 64×fs to fs.

What makes the audio disc player 1 distinct from conventional audio disc players is that it comprises the converter 7 and level controlling part 12. The converter 7 illustratively performs a fixed attenuation process halfway through conversion from the one-bit digital audio signal $D_1$ to the multi-bit digital audio signal $D_M$, while the level controlling part 12 effects control in such a manner that the multi-bit digital audio signal derived from the attenuation by the converter 7 will not exceed the full bit level.

In conventional audio disc players, a one-bit digital audio signal is converted to a multi-bit digital audio signal through down-sampling by a decimation filter having a predetermined maximum modulation degree, and then the converted multi-bit audio signal being output to a digital audio interface. During the process, the signal portions at overmodulated levels are always clipped to the maximum level for signal output. This necessarily brings about differences in terms of level and distortion factor between the analog audio signal derived from D/A conversion of the one-bit digital audio signal on the one hand and the multi-bit digital audio signal on the other hand.

Figure 6:
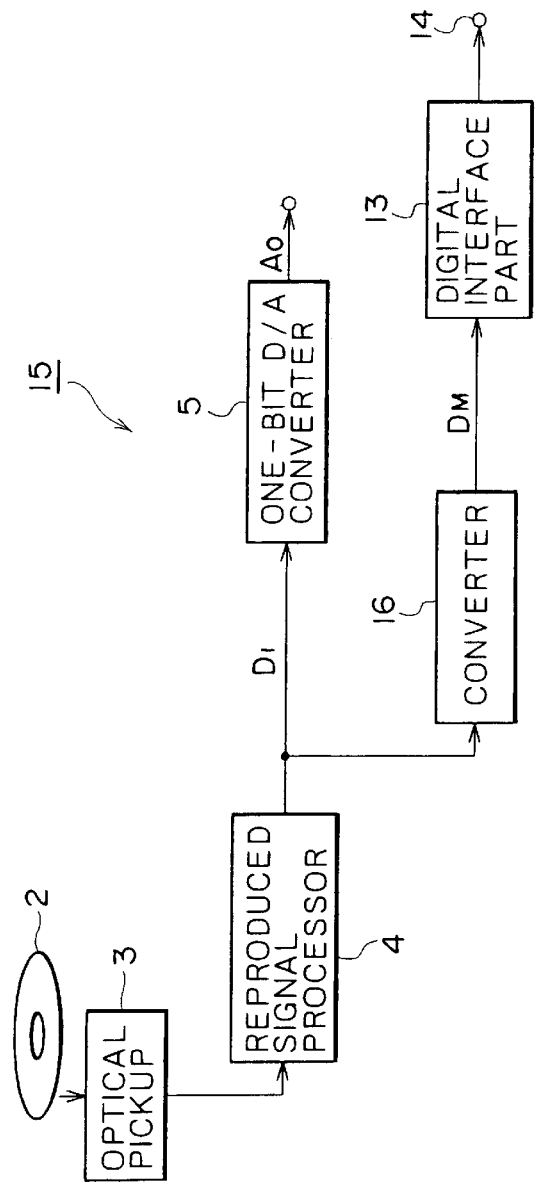
FIG. 6 is a block diagram of a conventional reproducing apparatus.

FIG. 6 shows a typical constitution of a conventional audio disc player 15 subject to the disadvantages outlined above.

In the conventional audio disc player 15, a converter 16 converts a one-bit digital audio signal $D_1$ from a reproduced signal processor 4 into a multi-bit digital audio signal $D_M$. Specifically, the converter 16 is a circuit called a decimation filter that converts the input one-bit digital audio signal to a multi-bit signal in several steps while reducing the sampling frequency rate to "fs" through decimation computations for down-sampling. The converter 16 effects no attenuation before the multi-bit digital audio signal $D_M$ is acquired. The multi-bit digital audio signal $D_M$, with its level not controlled by a suitable device such as the level controlling part 12 in FIG. 5, is supplied unmodified to a digital interface part 13.

In the conventional constitution above, any input exceeding the predetermined maximum modulation degree of the converter 16 is bound to cause the level at the digital output terminal 14 to be held clipped.

In the inventive audio disc player 1 of FIG. 5, by contrast, the converter 7 has the fixed quantity attenuator 8 installed upstream of the multi-bit conversion/decimation part 9. The multi-bit digital audio signal from the converter 7 is input to the digital interface part 13 by way of the level controlling part 12. The multi-bit digital audio signal is also sent to the level controlling part 10. A result of the processing by the level controlling part 10 is read by a system controller 11 which accordingly controls a level controlling process of the level controlling part 12.

In the audio disc player 1 of FIG. 5, the fixed quantity attenuator 8 attenuates the multi-bit data by a predetermined level before a potential overflow (i.e., clipped state) of the multi-bit data in the multi-bit conversion/decimation part 9 subject to a predetermined maximum modulation degree. Any input exceeding the predetermined maximum modulation degree is thus prevented from getting clipped. The level controlling part 12 compensates the attenuated quantity in order to maintain an average level. As such, the level controlling part 12 is ready to boost the signal level in a multi-bit signal state.

Figure 7:
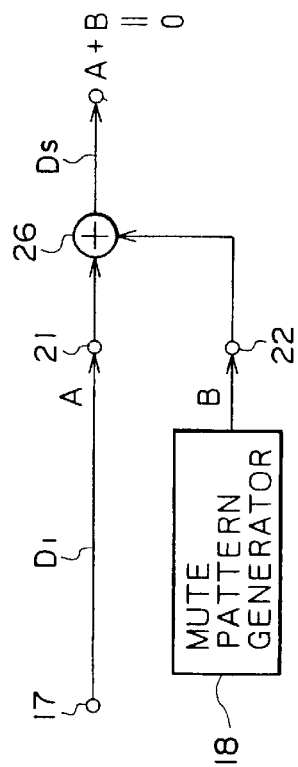
FIG. 7 is a detailed block diagram of a fixed quantity attenuator included in the apparatus of FIG. 5.

A specific example of the converter 7 is described below with reference to FIGS. 7 and 8. FIG. 7 shows a key portion of the fixed quantity attenuator 8, and FIG. 8 illustrates a key portion of the multi-bit conversion/decimation part 9.

The fixed quantity attenuator 8 comprises a mute pattern generator 18 and a one-bit adder 26. The mute pattern generator 18 generates a mute signal such as a one-bit digital audio signal derived from delta-sigma modulation and illustratively having a duty factor of 50 percent. The one-bit adder 26 adds up the mute signal from the mute pattern generator 18 and the one-bit digital audio signal $D_1$ fed through an input terminal 17. The mute pattern is a fixed pattern in which the ratio of binary 0 to binary 1 appearing as one-bit signal data at a sampling rate 64 times the rate fs is 1 to 1 during a predetermined period. When subjected to D/A conversion, the mute pattern corresponds to the zero level of an analog signal.

Figure 8:
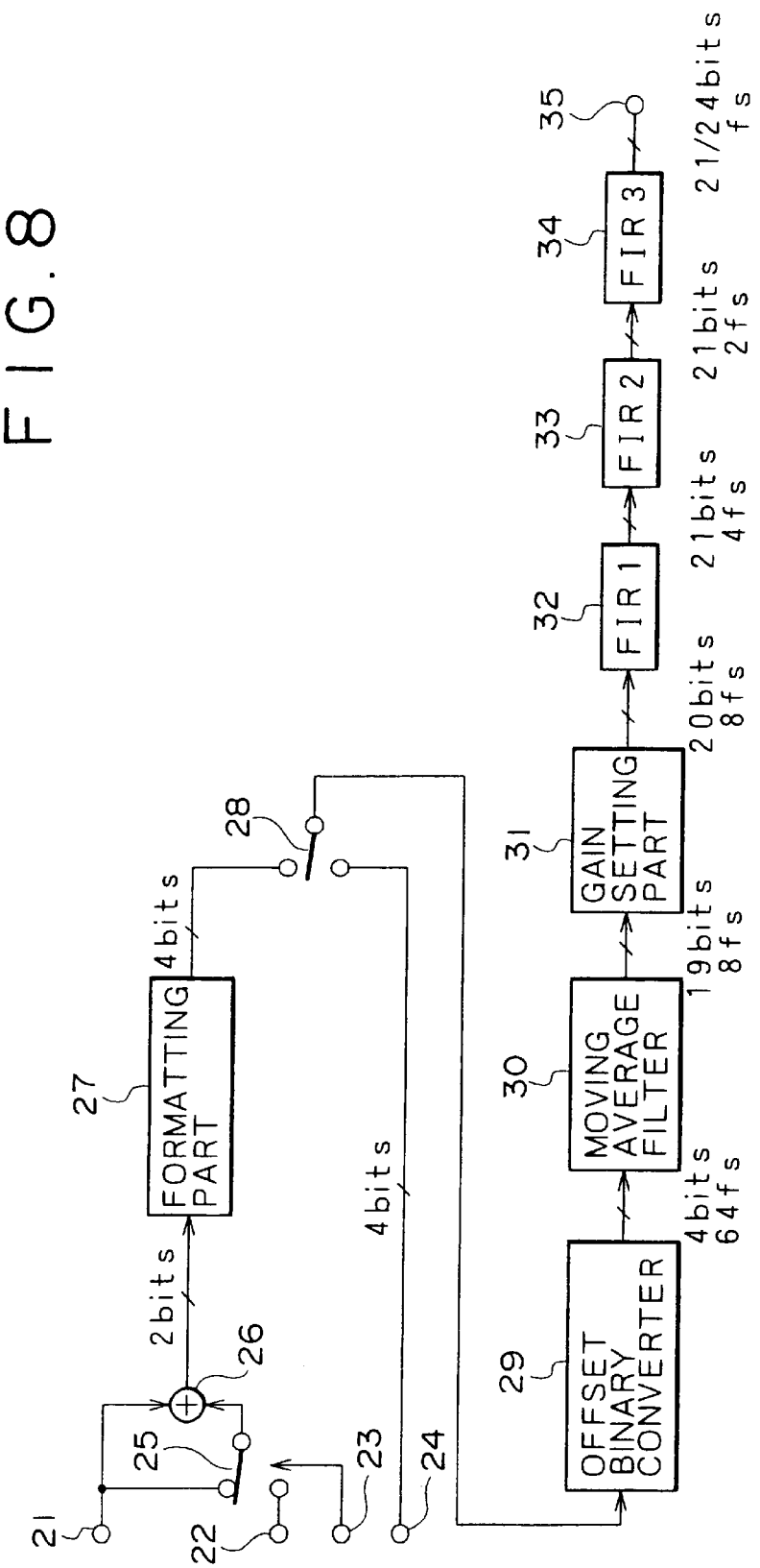
FIG. 8 is a detailed block diagram of a multi-bit conversion/decimation part included in the apparatus of FIG. 5.

The portion of the constitution downstream of terminals 21 and 22 is about the same as that preceding the multi-bit conversion/decimation part 9 shown in FIG. 8. When a changeover switch 25 in FIG. 8 is connected to a downside terminal that is selected, the adder 26 adds up the one-bit digital audio signal $D_1$ from the terminal 21 and the mute signal from the terminal 22. This setup is called a dual input arrangement.

On the other hand, if the changeover switch 25 in FIG. 8 is connected to an upside terminal that is selected, the adder 26 adds up two one-bit digital audio signals $D_1$ from the terminal 21. This setup is called a single input arrangement. An equivalent circuit of the fixed quantity attenuator 8 in that arrangement is shown in FIG. 9.

Figure 9:
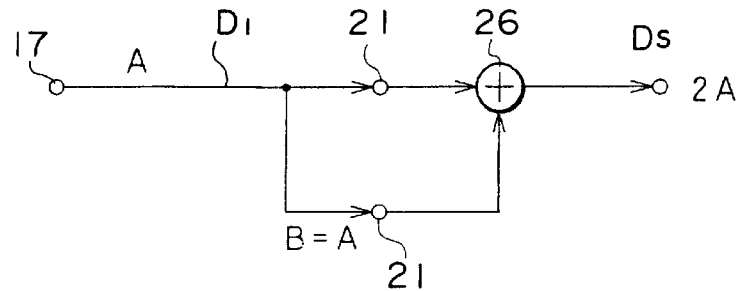
FIG. 9 is an equivalent circuit diagram of the multi-bit conversion/decimation part in the apparatus of FIG. 5.

Suppose that a one-bit digital audio signal from the converter 7 is composed of signals from two terminals 21 as shown in FIG. 9. An adder output signal Ds of the one-bit adder 26 is expressed as A+B. Since two inputs of the same one-bit digital audio signal $D_1$ are connected to the one-bit adder 26, the adder output signal Ds is in fact given as A+A, i.e., 2A.

Suppose now that the mute pattern generator 18 is connected to an input B (terminal 22) as depicted in FIG. 7. While the adder output Ds is given as A+B in FIG. 7, the input B constitutes a mute pattern (B=0). Thus the output turns out to be A+0, i.e., A. As opposed to the output of 2A from the arrangement of FIG. 9, the arrangement of FIG. 7 provides the output of A. That is, the output level is reduced by half, which means attenuation by a fixed quantity of 6 dB. This method is designed to provide fixed quantity attenuation through inclusion of a mute pattern in the early stage of conversion from a one-bit signal to a multi-bit signal. The attenuation is equivalent to lowering the signal level before it would be clipped in the multi-bit conversion/decimation part 9 located downstream.

In FIG. 8, a changeover control signal to actuate the changeover switch 25 for switchover between the dual and the single input arrangement is furnished from a control signal terminal 23. Alternatively, the changeover control signal may be generated manually by the user or may be created automatically by the system controller 11.

The remaining portions of the multi-bit conversion/decimation part 9 in FIG. 8 will now be described. A two-bit adder output signal Ds from the one-bit adder 26 is fed to a formatting part 27. The formatting part 27 replaces three two-bit values, e.g., "10" denoting 1+1, "01" representing 1+0 or 0+1, and "00" expressing "0+0", with three four-bit offset binary values. Illustratively, the two-bit values "10," "01" and "00" are converted to "1100" (+4), "1000" (0) and "0100" (−4) respectively.

The four-bit data from the formatting part 27 are sent to a changeover switch 28. The changeover switch 28 supplies an offset binary converter 29 either with an input having the sampling frequency of 64×fs and four quantization bits from an input terminal 24, or with an input having the sampling frequency of 64×fs and four quantization bits from the formatting part 27.

The offset binary converter 29 converts offset binary values having the sampling frequency of 64×fs and four quantization bits from the changeover switch 28 into complements of 2. Specifically, the values "1100," "1000" and "0100" are converted respectively to "0100," "0000" and "1100." The converted output of the offset binary converter 29 remains data having the sampling frequency of 64×fs and four quantization bits, the output being sent to a moving average filter 30.

The moving average filter 30 reduces the sampling rate of the received data to ⅛ of the initial rate and increases the word length to 19 bits. An output of the filter 30 having 19 quantization bits and the sampling frequency of 8×fs is fed to a gain setting part 31 wherein a gain is set.

Figure 3:
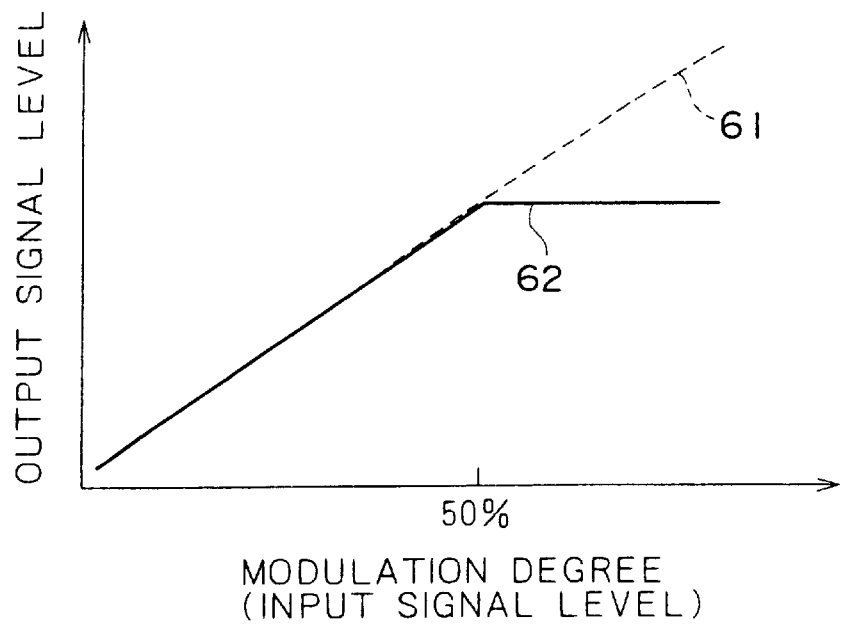
FIG. 3 is a graphic representation of characteristics indicating levels of an analog audio signal $A_O$ and of a multi-bit digital audio signal $D_M$ with respect to modulation degrees of a one-bit digital audio signal $D_1$.
Figure 4:
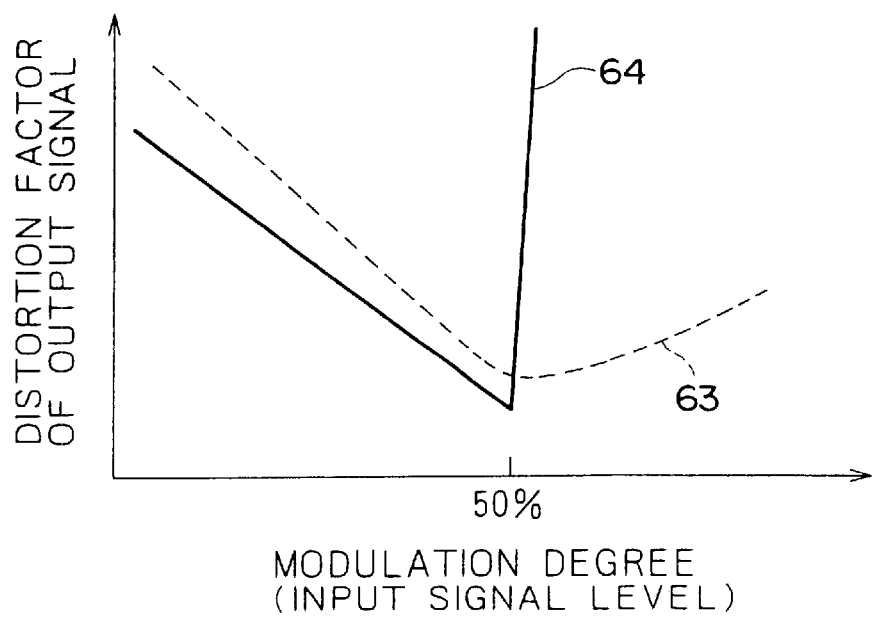
FIG. 4 is a graphic representation of characteristics depicting distortion factors of the analog audio signal $A_0$ and multi-bit digital audio signal $D_M$ with respect to modulation degrees of the one-bit digital audio signal $D_1$.

The gain setting part 31 works as an overflow limiter in which a limit to the characteristic 62 shown in FIG. 3 is defined. An output of the gain setting part 31 having the sampling frequency of 8×fs and 20 quantization bits is supplied to FIR (1) 32.

The FIR (1) 32 subjects the output of the gain setting part having the sampling frequency of 8×fs and 20 quantization bits to down-sampling and decimation, whereby an output with the sampling frequency of 4×fs and 21 quantization bits is acquired.

Past FIR (2) 33 and FIR (3) 34, the forwarded data are turned into data having the sampling frequency of fs and 21 or 24 quantization bits at a terminal 35.

Although the fixed quantity attenuation process is carried out in the input stage of the converter 7, this is not limitative of the invention. Alternatively, fixed quantity attenuation may be performed halfway through conversion from a one-bit digital audio signal to a multi-bit digital audio signal, specifically in a block upstream of the gain setting part 31.

Figure 10:
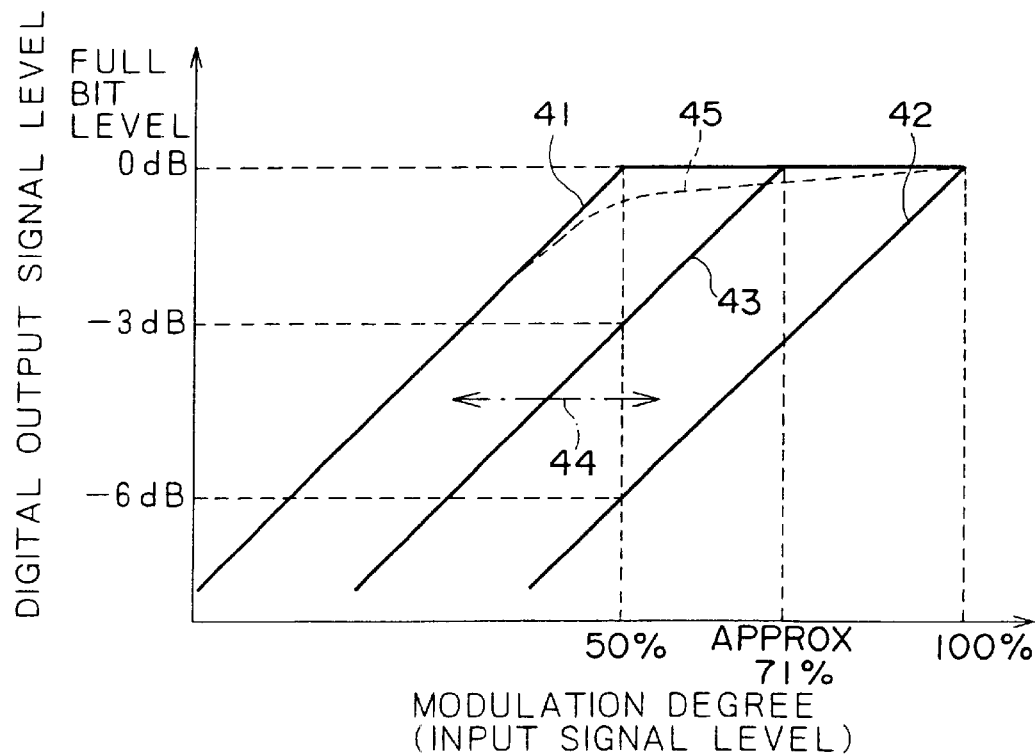
FIG. 10 is a graphic representation of characteristics plotting levels of digital output signals with respect to modulation degrees.

How the level controlling part 12 works will now be described in detail. FIG. 10 depicts control characteristics applicable to the level controlling part 12. If the predetermined maximum modulation degree of the multi-bit conversion/decimation part 9 is 50 percent, then a characteristic 41 of the multi-bit output from the conventional structure of FIG. 6 reaches a full bit level when the input signal level attains a modulation degree of 50 percent. For any further increase in the input, the output signal remains clipped to the full bit level. When the fixed quantity attenuation of 6 dB is carried out as described above by the fixed quantity attenuator 8, a characteristic 42 in effect at that point is at a level 6 dB lower than the full bit level for the modulation degree of 50 percent. Theoretically, the full bit level is reached when the level input has the modulation degree of 100 percent. That is, the output is never fixed to the full bit level regarding input at any level, and the input and output characteristics are kept linear. However, when the modulation degree is less than 50 percent, the output level is always 6 dB less than an original characteristic 41.

The potential trouble above is circumvented by the level controlling part 12 boosting the level as indicated by a characteristic 43 taking into account both the fixed attenuation quantity and the input modulation degree. For example, if the modulation degree of the input is about 71 percent at most, the level controlling part 12 increases the gain by 3 dB. Where the maximum modulation degree of the input is known or predicted in advance, such a boost of the level by a fixed gain quantity prevents the output from getting clipped. The average level, however, tends to be lower than normal. In such a case, a measuring instrument may be incorporated to measure modulation degrees of the one-bit digital audio signal $D_1$ input to the converter 7. Measurements taken by the measuring instrument may be input to the system controller 11.

If the maximum modulation degree of the input is unpredictable, the level detecting part 10 detects the level first. In accordance with the detected level from the level detecting part 10, the system controller 11 causes the level controlling part 12 to vary the gain dynamically. This constitutes an automatic gain adjusting arrangement whereby the curve of the characteristic 43 is varied over time within a predetermined range 44 in order to avoid a clipped level state.

It is also possible to constitute a limiter arrangement whereby the gain of the level controlling part 12 is varied statically as indicated by a characteristic 45 in order to form a level compressed curve. Compression starts at a level lower than the predetermined maximum modulation degree and the distortion factor worsens gradually. However, with the arrangement having the characteristic 45, the average level remains about the same as that of conventional setups and the compression helps avoid the clipped level state to a certain extent.

As described, how to raise the signal level following the fixed quantity attenuation may be determined in any one of diverse ways depending on the structures of the level controlling part 10, system controller 11 and level controlling part 12 as well as on the selection and combination of control systems.

The invention thus aims to avert the clipped level state by means of fixed quantity attenuation implemented upstream of the conversion to a multi-bit signal while raising the average level under control of the level controlling part located downstream.

That is, when a high-rate one-bit digital audio signal derived from delta-sigma modulation is converted down to a low-rate multi-bit digital audio signal, the signal level is attenuated prior to an overflow of the multi-bit data. At a later stage, the level of the multi-bit data is varied in a multi-bit state so that the output level will not exceed a predetermined value. This prevents the output of the multi-bit data from getting clipped to a maximum level even upon input of one-bit data exceeding a predetermined maximum modulation degree of the converting means in place.

As a result, there exists no difference in terms of level and distortion factor between the analog output obtained through D/A conversion of a one-bit signal following delta-sigma modulation on the one hand, and a multi-bit digital output on the other hand.

Although the audio disc player 1 of FIG. 5 has been presented as one preferred embodiment of the invention, this is not limitative of the invention. The invention may be applied alternatively to other devices and equipment including a digital signal processing apparatus comprising at least the converter 7 and level controlling part 12 of FIG. 5.

Such a digital signal processing apparatus receives a one-bit digital audio signal obtained by delta-sigma modulation and converts it to a multi-bit digital audio signal to be output.

The invention may also be applied to a digital signal processing apparatus comprising two recording systems: one system allowing a one-bit digital audio signal acquired by delta-sigma modulation to be written unmodified to a predetermined area of a recording medium such as an optical disc, and another system converting the one-bit digital audio signal to a multi-bit digital audio signal before writing the converted signal to another suitable area of the medium. This digital signal processing apparatus leaves no difference in terms of level and distortion factor between the two digital signals recorded by the two systems.

As described and according to the invention, a decimation filter having a predetermined maximum modulation degree is used to constitute a converter for converting a one-bit digital audio signal to a multi-bit digital audio signal through down-sampling. Upon input of a one-bit signal exceeding a maximum modulation degree specific to the converter, suitable arrangements are set in motion to prevent the multi-bit digital audio signal from getting clipped to a full bit level (maximum value) while prompting an average level of the output to rise.

As many apparently different embodiments of this invention may be made without departing from the spirit and scope thereof, it is to be understood that the invention is not limited to the specific embodiments thereof except as defined in the appended claims.

What is claimed is:

1. A transmitting apparatus comprising:

attenuating means for attenuating by a predetermined quantity an input one-bit digital signal formed of a first digital signal sampled at a first sampling frequency and having one bit quantization;

converting means for converting said first digital signal after attenuation by said attenuating means into a second digital signal sampled at a second sampling frequency lower than said first sampling frequency and having multiple bit quantization;

level detecting means for detecting a level of said second digital signal that was converted by said converting means; and amplifying means for amplifying the level of said second digital signal in response to the level detected by said level detecting means.

2. The transmitting apparatus according to claim 1, wherein said attenuating means includes:

mute signal generating means for generating a mute signal that is sampled at said first sampling frequency and having one bit quantization; and adding means for adding said first digital signal and said mute signal.

3. The transmitting apparatus according to claim 1, wherein said converting means includes a saturated output level depending on a modulation degree of said first digital signal input to said attenuating means.

4. The transmitting apparatus according to claim 1, further comprising:

modulation degree measuring means for measuring a modulation degree of said first digital signal input to said attenuating means; and controlling means for determining a control level for said amplifying means in response to said modulation degree of said first digital signal measured by said modulation degree measuring means and in response to said level detected by said level detecting means.

5. A reproducing apparatus comprising:

reproducing means for reproducing from a recording medium a first digital signal sampled at a first sampling frequency and having one bit quantization;

attenuating means for attenuating by a predetermined quantity said first digital signal reproduced by said reproducing means;

converting means for converting said first digital signal after attenuation by said attenuating means into a second digital signal sampled at a sampling frequency lower than said first sampling frequency and having multiple bit quantization;

level detecting means for detecting a level of said second digital signal converted by said converting means;

amplifying means for amplifying the level of said second digital signal in response to the level detected by said level detecting means; and transmitting means for transmitting said second digital signal amplified by said amplifying means.

6. The reproducing apparatus according to claim 5, wherein said attenuating means includes:

mute signal generating means for generating a mute signal that is sampled at said first sampling frequency and having one bit quantization; and adding means for adding said first digital signal and said mute signal.

7. The reproducing apparatus according to claim 5, wherein said converting means includes a saturated output level depending on a modulation degree of said first digital signal output from said reproducing means.

8. The reproducing apparatus according to claim 5, further comprising:

modulation degree measuring means for measuring a modulation degree of said first digital signal output from said reproducing means; and controlling means for determining a control level for said amplifying means in response to said modulation degree of said first digital signal measured by said modulation degree measuring means and in response to said level detected by said level detecting means.

* * * * *